(12) United States Patent
Lee et al.

(10) Patent No.: US 6,285,540 B1
(45) Date of Patent: Sep. 4, 2001

(54) SEMICONDUCTOR DEVICE HAVING A FUSE

(75) Inventors: Dong-Hun Lee, Seoul; Jong-Hyon Ahn, Suwon, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/560,359

(22) Filed: Apr. 28, 2000

Related U.S. Application Data

(62) Division of application No. 09/122,501, filed on Jul. 24, 1998, now Pat. No. 6,074,940.

(30) Foreign Application Priority Data

Jul. 26, 1997 (KR) .................................................. 97-35235

(51) Int. Cl.⁷ .................................................. H02H 5/04
(52) U.S. Cl. .................................................. 361/104
(58) Field of Search .................................. 361/103, 104; 257/586, 587, 588; 438/132, 215, 281, 333, 467, 597, 600, 601, 618, 622, 631; 148/DIG. 55

(56) References Cited

U.S. PATENT DOCUMENTS 5,472,901 * 12/1995 Kapoor ........................ 148/DIG. 55

\* cited by examiner

*Primary Examiner*—Ronald W. Leja
(74) *Attorney, Agent, or Firm*—Mills & Onello LLP

(57) ABSTRACT

The present invention provides a fuse of a semiconductor device and a method of forming a fuse of a semiconductor device. The method of the invention includes forming an underlying metal conductor on a semiconductor substrate, forming an insulating film over the underlying metal conductor, and selectively etching regions of the insulating film. One of the regions of the insulating film is etched to form a via contact region exposing the underlying metal conductor. A second region is etched to form a groove in the insulating film for the fuse metal. Metal is buried within the second etched region of the insulating film and the via contact region to respectively form a fuse metal pattern and a via contact metal layer.

3 Claims, 8 Drawing Sheets

SEMICONDUCTOR DEVICE HAVING A FUSE

RELATED APPLICATIONS

This application is a divisional of U.S. patent application Ser. No. 09/122,501, filed on Jul. 24, 1998, now issued U.S. Pat. No. 6,074,940, issued on Jun. 13, 2000, the contents of which are incorporated herein in their entirety by reference.

BACKGROUND OF THE INVENTION

1. Field of the Invention

The present invention relates to a method of forming a fuse in a semiconductor device and a semiconductor device which includes a fuse. In particular, the present invention relates to a method of forming a fuse in a semiconductor device which can prevent over-etching during a process of forming a fuse and can provide a good quality electrical characteristic.

2. Description of the Prior Art

In the process of forming more than two multi-layered metal conductors, such as address or data lines in SRAM memory cells, when a defect occurs in one or more bits of a SRAM cell, a repair process is performed which replaces the defective cells with excess or redundant cells. To accomplish this, the lines, such as address and data lines, of major or primary cells are connected to their counterparts in redundant cells by conductors which include fuses. The fuses can be selectively activated such as by laser to interrupt the continuity of the conductor and therefore disconnect the redundant cell from the primary cell. The repair process involves activating the fuses in the lines which connect redundant cells to functional primary cells. As a result of the repair process, only the fuse metal lines which connect the lines of the primary cells in which defects occurred to the lines of the redundant cells are left intact, and the remaining fuse lines are removed. Thus, the repair process prevents a malfunctional, thereby recovering overall performance of the chip.

In FIG. 1, there is shown a plan view of metal conductors in a semiconductor device with which a conventional multi-layered conductor structure is provided, and in FIG. 2A, there is shown a sectional view taken along the line A–A' in FIG. 1. The plan view of FIG. 1 shows a pattern of the metal conductors 30, typically made of aluminum, in which after the conductors 30 are formed, a fuse metal pattern 40 is formed by etching a barrier metal layer 25, typically made of TiN, which was deposited before the metal layer from which the conductors 30 are formed. After the etching, the portion 40 of the metal between the conductors 30 forms a fuse 40 which can be activated by laser cutting to break the connection between the conductors 30. The structure of FIG. 2A includes an insulating layer 1 on a semiconductor device on which are formed underlying metal conductor layers 10, an interlayer insulating film 15, via metal layers 20 connecting the underlying conductor layer 10 and conductors 30, and insulating film 35 which can be made of an oxide.

FIGS. 2B–2F illustrate the process of forming the device shown in FIGS. 1 and 2A. FIG. 2B illustrates the TiN barrier layer 25 formed on top of the interlayer insulating film 15. In the next step, as shown in FIG. 2C, the layer 30 from which the top conductors 30 will eventually be formed is deposited on top of the barrier layer 25. In one embodiment, the conductor layer 30 is formed of aluminum. The barrier layer 25 and conductor layer 30 are formed over via holes filled with via contact metal 20 such that the upper conductor layer 30 is in electrical contact with the lower conductor layer 10.

In the next step, as shown in FIG. 2C, a photoresist mask 31 is formed over the conductor layer 30. Next, a dry etching process is performed to form the conductor pattern 30. The dry etching removes both the aluminum layer 30 and the underlying TiN barrier layer 25 in selected regions. For example, as shown in FIG. 2D, the dry etching process leaves the pattern of conductors 30 and barrier layer 25 on the insulating layer 15 separated by gaps or channels 41.

As illustrated in FIG. 2D, the gaps 41 separate portions 30B of the conductor layer 30 from the portion 30A of the conductor. Next, as shown in FIG. 2E, an oxide layer 35 is formed over the conductor layer 30. Next, a second photoresist mask 37 is formed over the oxide layer 35 such that an opening in the mask 39 provides access to the conductor 30A. The opening 39 is positioned over the barrier layer 25 to define the position of the fuse portion 40 of the barrier layer 25.

Next, both a dry and highly selective wet etching process are performed to remove the oxide 35 and the conductive aluminum layer 30A in the opening 39. The dry etching step is used to remove the oxide layer 35 and much of the aluminum 30. Because the dry etching process tends to be difficult to control and therefore can easily overetch, the dry etch is stopped before it reaches the bottom of the aluminum conductor 30A. Then, a highly selective wet etching process, which removes only aluminum and leaves TiN intact, is used to remove the remainder of the aluminum in the conductor 30A. The selective wet etching is used to prevent any over-etching into the barrier layer 25 since any such over-etching would damage the fuse portion 40 and render it ineffective for use as a fuse. As shown in FIG. 2F, the remaining conductors are connected by the remaining fuse portion 40 of the barrier layer 25.

Hence, the process of forming devices illustrated in FIGS. 1 and 2A–2F can be time consuming, inefficient, and, therefore, expensive due to the need for special etching steps to protect the fuse material. Also, because the resulting device is located at the top layer, both the fuse layer 40 and the sides of the conductors 30 are vulnerable to external damages and undesirable contact with foreign matter.

SUMMARY OF THE INVENTION

It is an object of the present invention to solve the problems in the prior art and to provide a method of forming a fuse in a semiconductor device which makes it possible to form a fuse metal layer having a good conductivity characteristic, by forming a fuse using a planarization process and forming a via metal layer that connects a conductor layer and another conductor layer underlying it.

In order to achieve the above object, a method of forming a fuse of a semiconductor device according to the present invention comprises the steps of forming an underlying metal conductor on a semiconductor substrate; forming an insulating film on the upper portion of said underlying metal conductor; selectively etching a first region of said insulating film to form a via contact region exposing said underlying metal conductor; selectively etching a second region of said insulating film; and burying metal within the second etched region of said insulating film and said via contact region to respectively form a fuse metal pattern and a via contact metal layer.

BRIEF DESCRIPTION OF THE DRAWINGS

The above objects, and other features and advantages of the present invention will become more apparent from the following description of preferred embodiments thereof with reference to the accompanying drawings, in which.

DETAILED DESCRIPTION OF PREFERRED EMBODIMENTS

Figure 1:
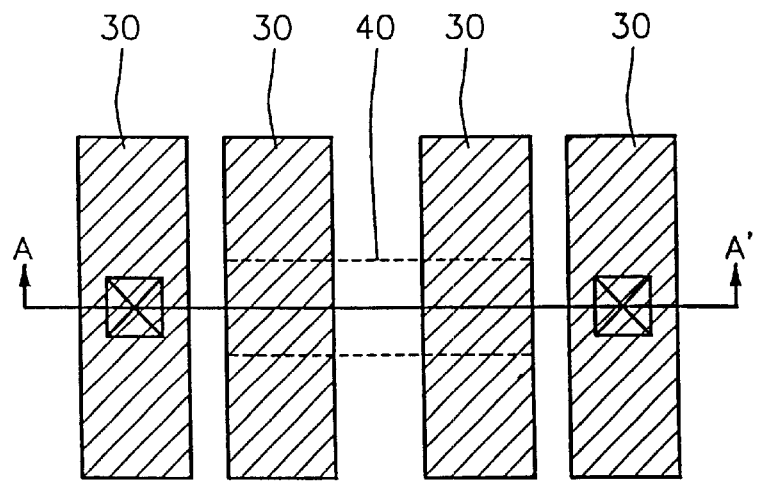
FIG. 1 is a plan view of final metal conductors in a semiconductor device with which a conventional multi-layered conductor structure is provided.
Figure 2A:
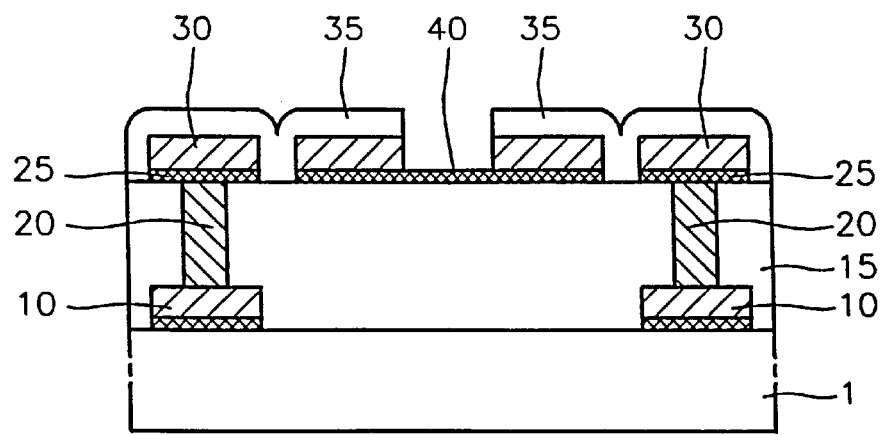
FIG. 2A is a sectional view taken along the line A–A' in FIG. 1.
Figure 2B:
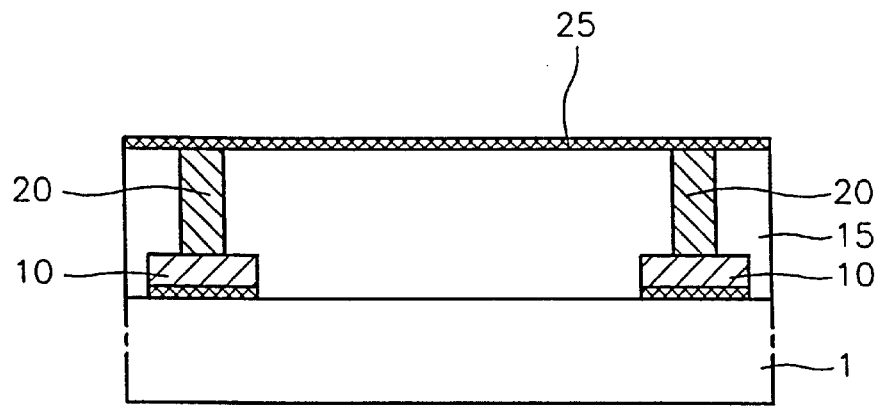
FIGS. 2B–2F schematically illustrate the steps used in forming the structure of FIGS. 1 and 2A.
Figure 2C:
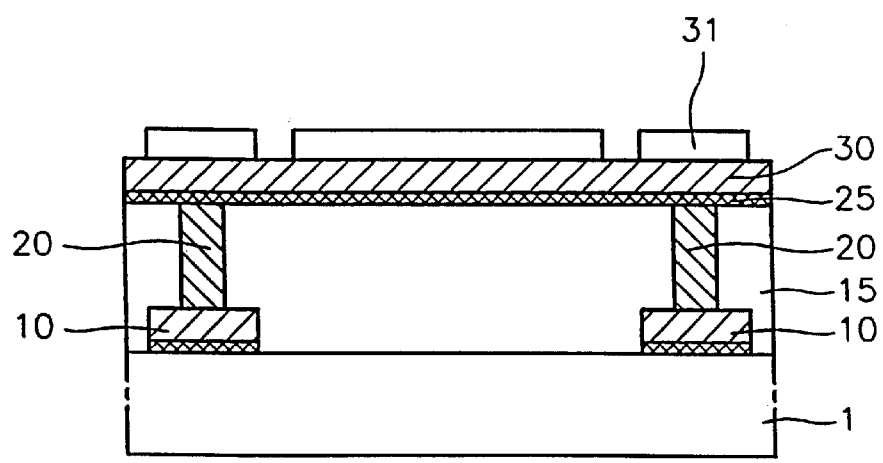
Figure 2D:
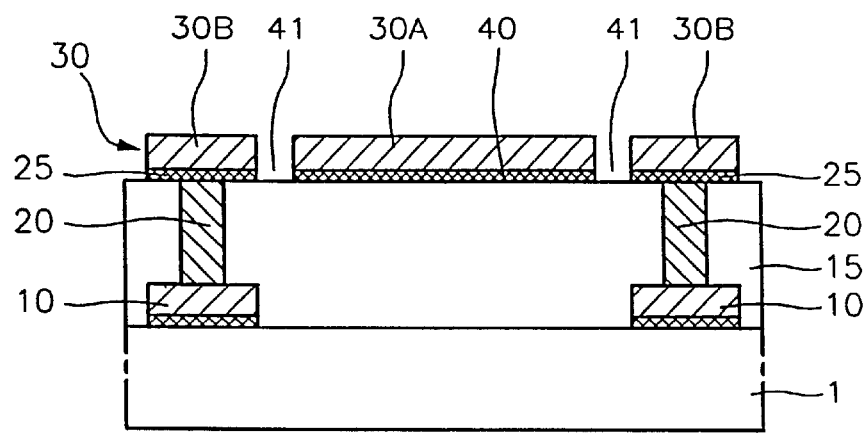
Figure 2E:
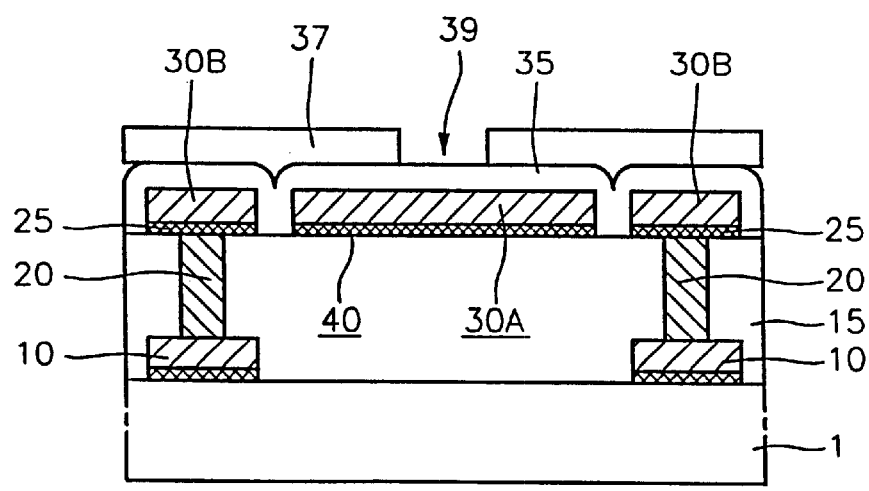
Figure 2F:
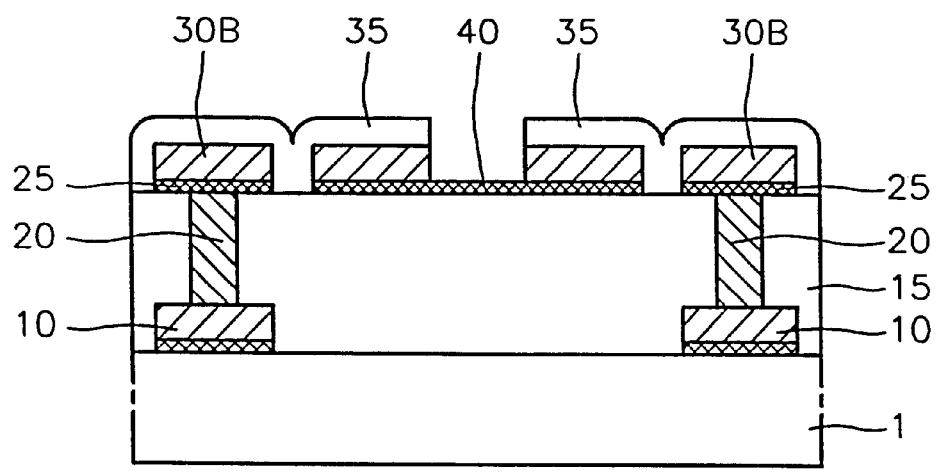
Figure 3:
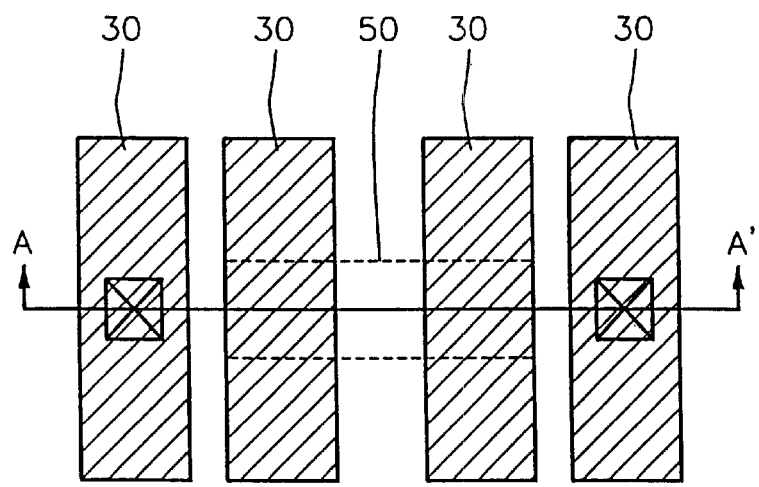
FIG. 3 is a plan view of upper metal conductors in a semiconductor device with which a multi-layered conductor structure is provided according to the present invention.
Figure 4:
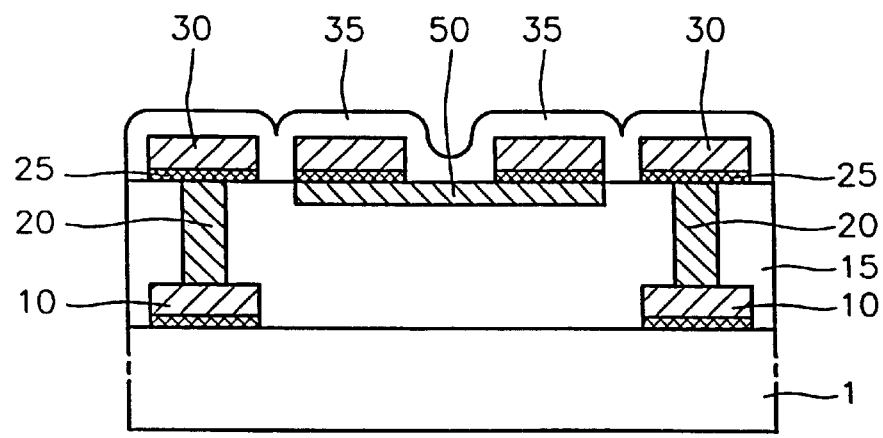
FIG. 4 is a sectional view taken along the line A–A' in FIG. 3.

FIG. 3 contains a plan view of a metal conductor structure in a semiconductor device with which multi-layered metal conductors 30, formed of a conductive material such as aluminum, are provided according to the present invention. FIG. 4 contains a sectional view taken along the line A–A' in FIG. 3.

In one embodiment, the semiconductor device according to the present invention comprises a patterned underlying metal conductor layer 10 on an insulating film 1 formed on the semiconductor device. An interlayer insulating film 15 covers the underlying metal conductor layer 10. An upper metal conductor layer 30 is formed on the interlayer insulating film 15. A via contact metal layer 20 is filled into a via or a contact formed in the interlayer insulating film 15 in order to form an electrical contact between the underlying metal conductor layer 10 and the upper metal conductor layer 30.

A fuse metal pattern 50 is formed within grooves formed at a predetermined depth from the surface of the interlayer insulating film 15. The fuse layer 50 connects conductors of the conductor layer 30. The fuse metal pattern 50 can be formed with the same metal as the via contact metal layer 20, which in one embodiment is tungsten. The structure is covered by a protective insulating layer 35 which protects the device from external damage and can be formed of, for example, oxide or BPSG.

The conductors 30 and underlying conductors 10 can be conductors of integrated circuits such as a SRAM cell. The inner conductors 30, which are connected by fuse metal pattern 50, can be corresponding conductors, e.g., address or data lines, for a primary SRAM cell and a redundant cell. During a repair process, the fuse pattern 50 can be activated such as by laser cutting through the oxide covering layer 35 to disconnect the two inner conductors 30 from each other to remove the redundant cell from the primary cell where the primary cell is functioning properly. When the primary cell is defective, the fuse metal 50 can be left intact to allow the redundant cell to continue operating and thereby continue performance of a system without degradation.

The fuse metal pattern 50 according to the present invention is formed before final metal conductors 30 are formed, preferably with the same metal as the via contact metal layers 20 filled into the grooves 17, described below in detail in connection with FIGS. 5A–5F. The grooves 17 are formed in the interlayer insulating film 15 in which the final metal conductors 30 will be later formed, as shown in FIG. 4.

Figure 5A:
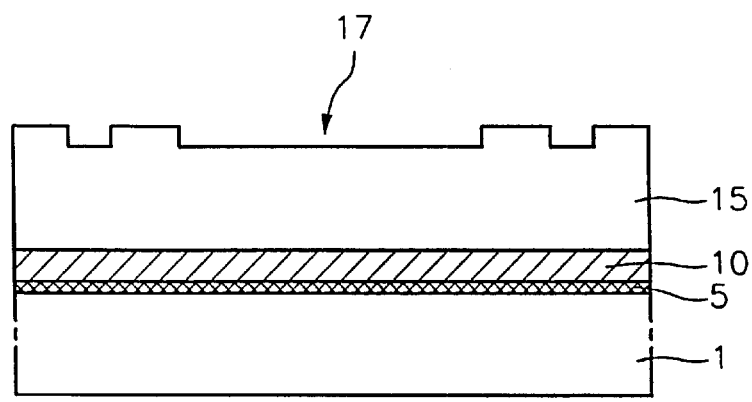
FIGS. 5A through FIG. 5F schematically illustrate the steps used in forming the multi-layered conductor structure of FIG. 4 in accordance with the present invention.

A method of forming a fuse in a semiconductor device according to one embodiment of the present invention will be described below with reference to FIGS. 5A–5F, which schematically illustrate the method. First, as shown in FIG. 5A, a barrier metal layer 5 and a metal layer 10 are sequentially formed on an insulating film 1 on a semiconductor substrate. They are then patterned as desired to form an underlying metal conductor pattern. The underlying metal conductor 10 is a conductor layer which is formed before a final upper metal conductor 30 in a semiconductor device of a multi-layered structure. Next, an interlayer insulating film 15 made of, for example, BPSG, is formed on the resulting surface. Then, the interlayer insulating film 15 is planarized by etch back or CMP (chemical mechanical polishing).

Next, a first region of the interlayer insulating film 15, which corresponds to a via contact region that will connect the underlying metal conductor 10 and an upper metal conductor (final metal conductor) which will be formed later, is selectively etched through a photolithography process. In one embodiment, at the same time, a second region in the form of a groove 17 in which the fuse metal pattern 50 will be formed is also etched. It is preferred that the depth being etched, i.e., the thickness of a desired fuse metal 50, is, for example, approximately 300–4000 Å.

Figure 5B:
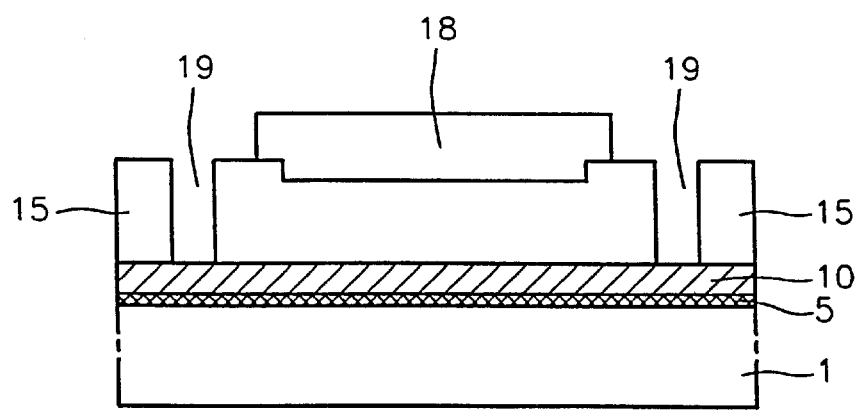

Next, as shown in FIG. 5B, the groove 17 is covered with a photoresist mask 18 by a photolithography process. A second etching process is then performed to form the via 19 to expose the top surface of the underlying metal conductor 10.

Figure 5C:
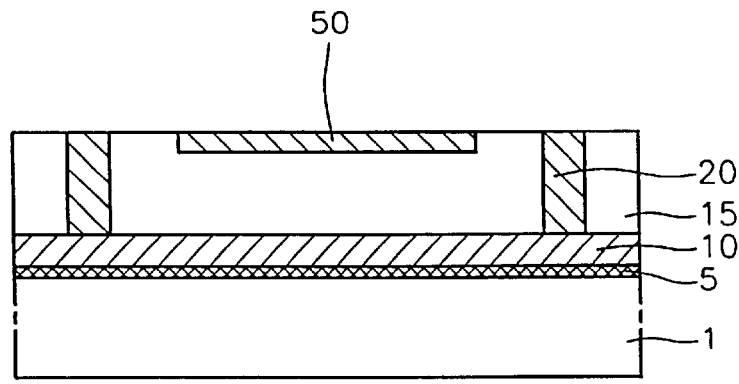

Next, as shown in FIG. 5C, a metal for forming a via metal layer, such as, for example, tungsten, is deposited on the surface of the selectively etched interlayer insulating film 15. Then, a planarization process, such as CMP, etch back, reflow, etc, is performed to define the via contact metal 20 and the fuse metal pattern 50.

Figure 5D:
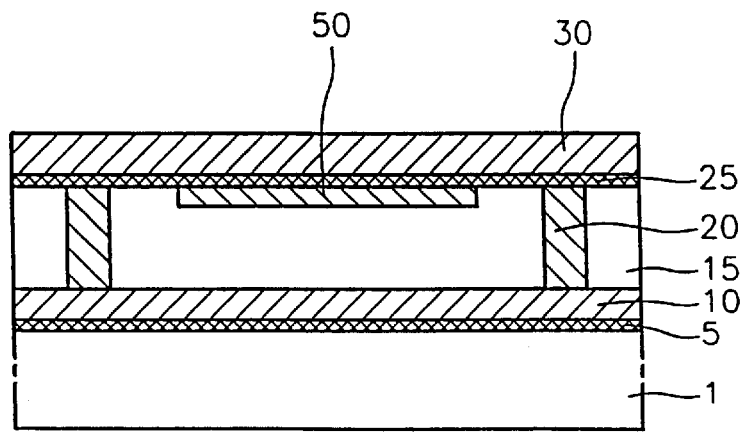
Figure 5E:
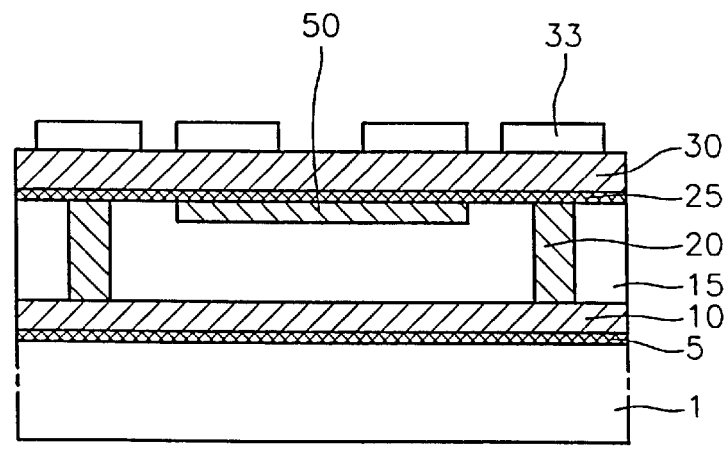
Figure 5F:
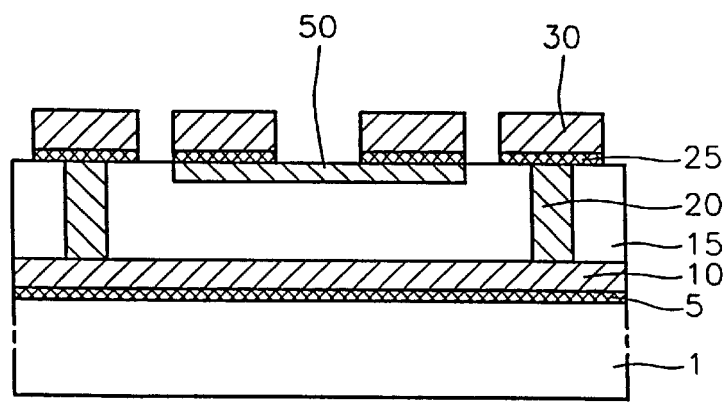

Next, as shown in FIG. 5D, a barrier metal layer 25, made of, for example TiN, is formed over the insulator 15, via contacts 20 and fuse metal pattern 50. Next, an upper conductor layer 30 made of, for example, aluminum, is formed over the barrier metal layer 25. Next, as shown in FIG. 5E, a photoresist mask 33 is formed over the conductor layer 30. Next, to pattern the conductor layer 30 and expose the fuse metal 50, an appropriate etching method, such as a single dry etching method, can be performed to remove the unmasked portions of both the aluminum conductor layer 30 and the underlying barrier layer 25. The patterned metal conductor 30 is connected to the underlying metal conductor 10 through the via contact metal 20 as required. In the resulting structure, as shown in FIG. 5F, unlike the prior art fuse material made of the TiN barrier metal, the fuse metal 50 of the present invention, preferably made of tungsten, remains undamaged by the single dry etching process because of its dense physical properties.

As shown in FIG. 4, the final device can be covered with a protective insulating layer 35 made of, for example, an oxide. The portion of the oxide layer 35 that covers the fuse layer 50 provides protection for the device but does not impede the fuse cutting process, which is typically performed with a laser which easily penetrates the oxide layer 35.

As described above, the present invention forms a fuse metal layer before formation of a final metal conductor using the same number of photolithography process steps. As such, with the fuse metal layer formed before formation of the final metal conductor, several advantages are realized. For example, the need for multiple dry and wet etching steps is eliminated, resulting in substantial process time and cost savings. Also, the prior art approach of a dual-etch process and relying on selectivity of a wet etch process to define the fuse and conductor layers is more complex and prone to error than the approach of the invention. Also, because the fuse material is made of tungsten instead of the prior art TiN material, over-etching is eliminated since the tungsten resists damage under dry etching. Also, the tungsten fuse metal of the invention has higher conductivity than prior art materials, such that a fuse having a better conductivity characteristic is obtained.

While the present invention has been described and illustrated herein with reference to the preferred embodiment thereof, it will be understood by those skilled in the art that various changes in form and details may be made therein without departing from the spirit and scope of the invention.

What is claimed is:

1. A semiconductor fuse device, comprising:

an underlying metal conductor formed on a semiconductor substrate;

an interlayer insulating film over said underlying metal conductor;

a selectively etched first region of said insulating film forming a conductive metal region;

a second selectively etched region of said insulating film, said second region being selectively etched to a predetermined depth; and a metal buried within the first and second etched regions to form a conductive metal and a fuse metal, respectively, the metal and the insulating layer including the second etched region and the conductive metal region being chemically mechanically polished to be planarized such that the fuse metal has a rectangular planar shape.

2. A semiconductor fuse device as claimed in claim 1 wherein said metal comprises tungsten.

3. A semiconductor fuse device as claimed in claim 1 wherein said predetermined depth is 300–4000 Å.

* * * * *